(12) United States Patent
Wilsher

(10) Patent No.: US 6,819,117 B2
(45) Date of Patent: Nov. 16, 2004

(54) PICA SYSTEM TIMING MEASUREMENT & CALIBRATION

(75) Inventor: Kenneth R. Wilsher, Palo Alto, CA (US)

(73) Assignee: Credence Systems Corporation, Milpitas, CA (US)

(*) Notice: Subject to any disclaimer, the term of this patent is extended or adjusted under 35 U.S.C. 154(b) by 0 days.

(21) Appl. No.: 10/066,123

(22) Filed: Jan. 30, 2002

(65) Prior Publication Data

US 2003/0141879 A1 Jul. 31, 2003

(51) Int. Cl.⁷ .......................... G01R 35/00; G04F 15/00
(52) U.S. Cl. ...................................... 324/601; 368/120
(58) Field of Search ................................ 324/601, 752, 324/753, 751, 76.52, 76.53, 76.58, 76.18, 76.25; 368/120

(56) References Cited

U.S. PATENT DOCUMENTS

| 4,637,733 A | 1/1987 | Charles et al. |
| 5,057,771 A | 10/1991 | Pepper |
| 5,900,755 A | * 5/1999 | Toeppen et al. ............ 327/163 |
| 5,940,545 A | 8/1999 | Kash et al. |

OTHER PUBLICATIONS

D. Porat, "Review of Sub–Nanosecond Timer–Interval Measurements," IEEE Transactions on Nuclear Science, vol. NS–20, No. 5, 1973, pp. 36–51.

M. Fahmie, "A System for Providing High Quality Triggers to Experimental Areas," Proceedings of the Particle Accelerator Converence 1999, Mar. 27, 1999, pp. 756–758.

* cited by examiner

Primary Examiner—Guy J. Lamarre
Assistant Examiner—James C. Kerveros
(74) Attorney, Agent, or Firm—Dorsey & Whitney LLP

(57) ABSTRACT

PICA probe system methods and apparatus are described, including methods and apparatus for calibrating an event timer having a coarse measurement capability in which time intervals defined by clock boundaries are counted and a fine measurement capability in which time between boundaries is interpolated using a voltage ramp.

6 Claims, 11 Drawing Sheets

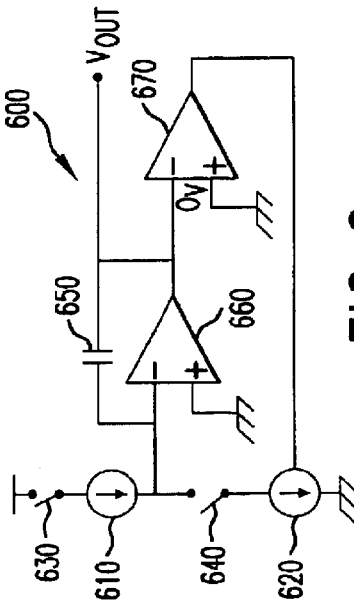
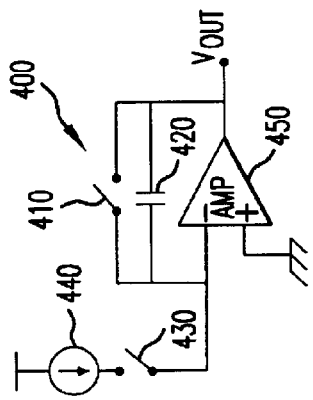
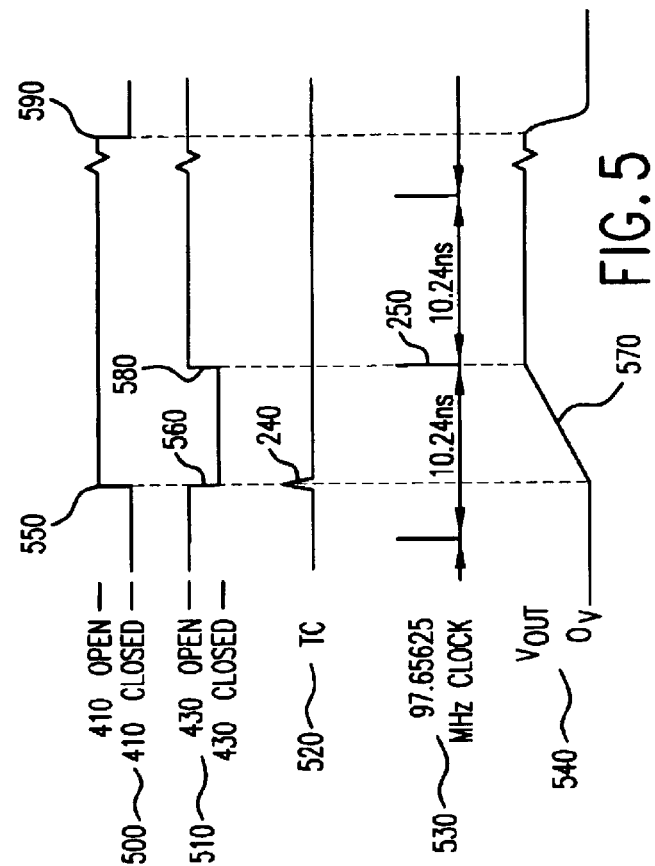
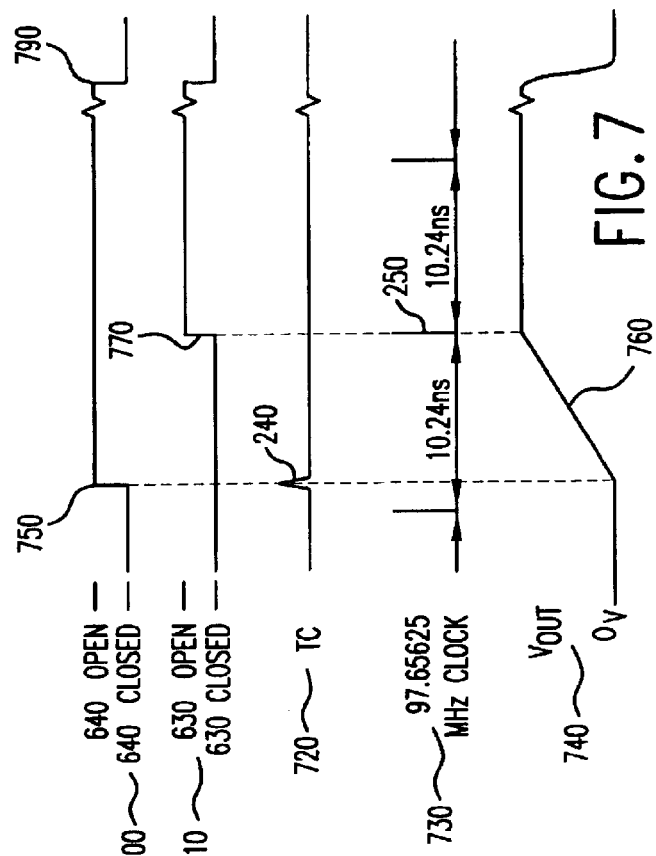

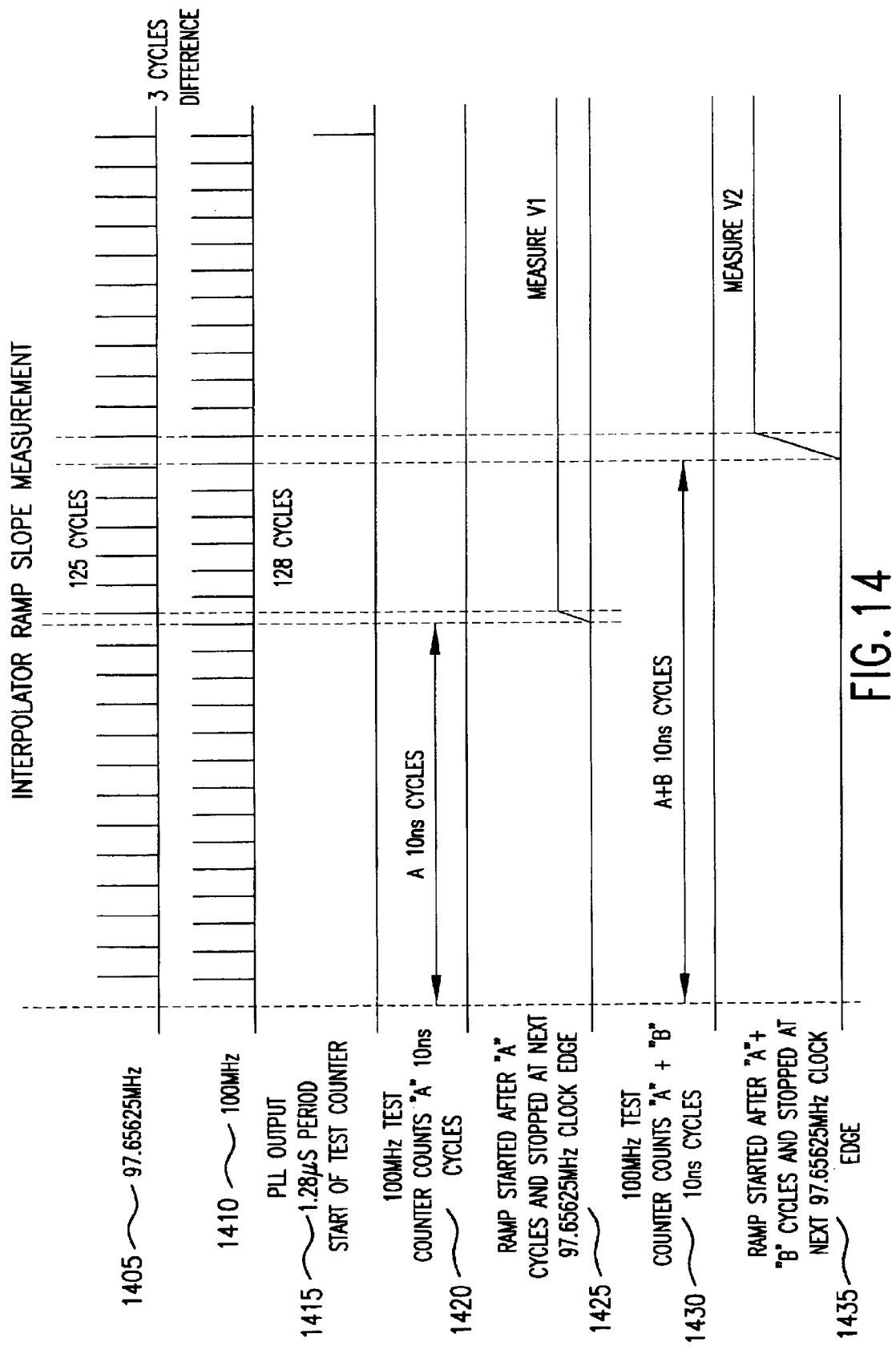

PICA SYSTEM TIMING MEASUREMENT & CALIBRATION

BACKGROUND

1. Field of the Invention

The present invention relates to timing measurement of signals in PICA (picosecond imaging circuit analysis) systems, and particularly to methods and apparatus for timing measurement and calibration of timing measurement.

2. Prior Art

New package types, shrinking process geometries and new material pose challenges for gathering vital timing measurement during the integrated circuit (IC) design debug and validation process. Increasingly sensitive devices are easily perturbed during probing, which skews results and slows the design process.

Fault localization methods using beam probe systems are time-consuming even with access to IC layout knowledge since each node must be probed serially to trace the location of a faulty circuit element. Tester and other equipment time is often limited, forcing design debug experts to extract timing measurements from the device one probing session at a time, often adding weeks to the debug and verification cycle.

Timing data acquisition and analysis can be a development bottleneck. With conventional serial probe systems, skilled IC diagnostic experts are required to analyze the critical device data to know which node to probe next. Though companies often develop multiple products simultaneously, data acquisition, review and analysis capabilities are available only at the probe system's site. If a single node is missed, a new probe session must be set up, effectively limiting progress to one device at a time.

Silicon on insulator (SOI) technology offers increased power capabilities and device performance, but its sensitive structure requires non-invasive probing. Devices manufactured with 0.13-micron geometry have critical signal nodes so small and numerous that the acquisition process is too time-consuming for efficient probe by serial, beam-based instruments.

Picosecond Imaging Circuit Analysis (PICA) technology developed by IBM uses naturally occurring light emission from stimulated CMOS transistors to extract timing measurements and localize faults. Detecting the emitted light with high-speed optical detectors allows circuit switching to be monitored. By imaging and time-resolving light emission from many devices on an operating chip, the flow of information through the chip can be displayed as a movie.

More details of PICA methods and systems are found in the following documents which are incorporated herein by this reference: U.S. Pat. No. 5,940,545 dated Aug. 17, 1999, Kash et al., *Noninvasive Optical Method for Measuring Internal Switching and Other Dynamic Parameters of CMOS Circuits*; U.S. Pat. No. 6,028,952 dated Feb. 22, 2000, Kash et al., *System and Method for Compressing and Analyzing Time-Resolved Optical Data Obtained from Operating Integrated Circuits*; U.S. Pat. No. 6,172,512 dated Jan. 9, 2001, Evans et al., *Image Processing Methods for the Optical Detection of Dynamic Errors in Integrated Circuits*; U.S. Pat. No. 6,304,668 (withdrawn) dated Oct. 16, 2001, Evans et al., *Using Time Resolved Light Emission from VLSI Circuit Devices for Navigation on Complex Systems*; European patent publication EP 0 937 989 published Aug. 28, 1999, Evans et al., IBM, *Using Time Resolved Light Emission from VLSI Circuit Devices for Navigation on Complex Systems*; J. BUDE, *Hot-carrier luminescence in Si*, PHYS. REV. B, 45(11), Mar. 15, 1992, pages 5848–5856; S. VILLA et al., *Photon emission from hot electrons in silicon*, PHYS. REV. B, 52(15), Oct. 15, 1995-I, pages 10993–10999; J. KASH et al., *Full Chip Optical Imaging of Logic State Evolution in CMOS Circuits*, IEDM 96 Late News Paper (1996) 1, pages 934–936; D. KNEBEL et al., *Diagnosis and Characterization of Timing-Related Defects by Time-Dependent Light Emission*, ITC PROCEEDINGS 1998; M. BRUCE et al., *Waveform Acquisition from the Backside of Silicon Using Electro-Optic Probing*, PROCEEDINGS FROM THE $25^{TH}$ INTERNATIONAL SYMPOSIUM FOR TESTING AND FAILURE ANALYSIS, Nov.14–18, 1999, pages 19–25; T. EILES et al., *Optical Probing of VLSI IC's from the Silicon Backside*, Proceedings from the $25^{th}$ International Symposium for Testing and Failure Analysis, Nov. 14–18, 1999, pages 27–33, and M. MCMANUS, *Picosecond Imaging Circuit Analysis of the IBM G6 Microprocessor Cache*, PROCEEDINGS FROM THE $25^{TH}$ INTERNATIONAL SYMPOSIUM FOR TESTING AND fAILURE ANALYSIS, Nov. 14–18, 1999, pages 35–38.

Precise time resolution of the detected photons is important in electro-optic probing. Suitable high-resolution timing measurement methods and apparatus are desired, along with methods for their calibration.

SUMMARY OF THE INVENTION

In accordance with embodiments of the invention, methods are provided for calibrating a timer having a coarse measurement capability in which time intervals defined by boundaries are counted and a fine measurement capability in which time between boundaries is interpolated using a voltage ramp, comprising: determining alignment of the voltage ramp relative to a reference-clock signal having a known relationship to the boundaries; sampling the voltage ramp at a plurality of known times relative to the boundaries; and determining slope of the voltage ramp as a function of time from the voltage samples.

The voltage ramp can be aligned relative to the time interval boundaries. The time intervals can be defined by an interval clock signal at a first frequency, and the interval clock signal phase-locked to a reference-clock signal at a second frequency to define phase relationship between the interval-clock signal and the reference-clock signal. Aligning the voltage ramp comprises starting the voltage ramp at a defined number of periods of the reference-clock signal following coincidence of the interval-clock signal and the reference-clock signal. Sampling the voltage ramp at a plurality of known times comprises: starting the voltage ramp following a first number of cycles of the reference-clock signal following coincidence of the interval-clock signal and the reference-clock signal, and sampling the voltage ramp at a subsequent clock edge of the interval-clock signal to obtain a first voltage sample.

Sampling the voltage ramp at a plurality of known times can comprises: starting the voltage ramp following a second number of cycles of the reference-clock signal following coincidence of the interval-clock signal and the reference-clock signal; and sampling the voltage ramp at a subsequent clock edge of the interval-clock signal to obtain a second voltage sample. Preferably the interval-clock signal and the reference-clock signal are substantially out of phase with one another when voltage ramp is sampled.

The methods can further comprise determining from the phase relationship between the interval-clock signal and the reference-clock signal a time difference between the respective known times at which the voltage ramp is sampled to obtain the first voltage sample and the second voltage sample. Determining slope of the voltage ramp may comprise calculating the a ratio of difference in voltage between the second voltage sample and the first voltage sample to the time difference between the respective known times at which the voltage ramp is sampled to obtain the first voltage sample and the second voltage sample.

Embodiments of apparatus in accordance with the invention include an event timer and comprise: a coarse-measurement counter for counting time intervals defined by boundaries, a fine-measurement interpolator employing a voltage ramp to measure a time delay of less than one of the time intervals; a source of an interval-clock signal at a first frequency and a reference-clock signal at a second frequency with a defined phase relationship between the interval-clock signal and the reference-clock signal; and an analog-to-digital converter for sampling the voltage ramp at a plurality of known times relative to the boundaries to obtain voltage samples from which slope of the voltage ramp can be calculated.

The apparatus may further comprise a processor for determining slope of the voltage ramp as a function of time from the voltage samples. The source may comprise a first unit for generating the interval-clock signal, a second unit for generating the reference-clock signal, and a phase-locked loop to maintain the interval clock-signal and the reference-clock signal in a defined phase relationship. The phase-locked loop maintains the interval-clock signal and the reference-clock signal in a defined phase relationship in which the interval-clock signal and the reference-clock signal are periodically coincident, the apparatus further comprising a counter to count cycles of the reference-clock signal and to initiate the voltage ramp when a predetermined count is reached. The analog-to-digital converter is responsive to the counter and to the interval-clock signal to sample the voltage ramp at an edge of the interval-clock occurring subsequent to initiation of the voltage ramp.

The invention further comprises a PICA probe system and methods for operating and calibrating event timing of such a system. Embodiments of a PICA probe system comprise: a PICA collection camera; acquisition electronics responsive to strobe pulses from the PICA collection camera representing photon-detection events for collecting data about such events, including a timing subsystem having a coarse-measurement counter for counting time intervals defined by boundaries and a fine-measurement interpolator employing a voltage ramp to measure a time delay of less than one of the time intervals; and a workstation having a processor in communication with the PICA collection camera and the acquisition electronics for controlling operation and for processing data collected by the acquisition electronics.

The PICA system may further comprising a source of an interval-clock signal at a first frequency and a reference-clock signal at a second frequency with a defined phase relationship between the interval-clock signal and the reference-clock signal, and an analog-to-digital converter for sampling the voltage ramp at a plurality of known times relative to the boundaries to obtain voltage samples from which slope of the voltage ramp can be calculated.

The PICA system may further comprise a phase-locked loop to maintain the interval-clock signal and the reference-clock signal in a defined phase relationship in which the interval-clock signal and the reference-clock signal are periodically coincident, and further comprising a counter to count cycles of the reference-clock signal and to initiate the voltage ramp when a predetermined count is reached.

These and other features of the invention will become apparent to those of skill in the art from the following description and the accompanying drawing figures.

BRIEF DESCRIPTION OF THE DRAWING

FIG. 4 is a schematic diagram of a time-to-voltage interpolator;

FIG. 5 is a timing diagram illustrating the operation of the interpolator of FIG. 4;

FIG. 6 is a schematic diagram of an alternate time-to-voltage interpolator;

FIG. 7 is a timing diagram illustrating the operation of the interpolator of FIG. 6;

FIG. 14 illustrates timing relationship of signals in interpolator ramp calibration.

DETAILED DESCRIPTION

Schlumberger Technologies, Inc. of San Jose, Calif. offers commercially its IDS® PICA diagnostic probe system featuring IBM Picosecond Imaging Circuit Analysis technology The system uses PICA technology to detect naturally occurring light emission from stimulated CMOS transistors. Non-invasive capture of inherent signals from device transistors switching enables precise timing measurements and fault localization. The accumulated PICA data is stored for display and/or analysis. The system is capable of probing devices manufactured on advanced processes, including optical imaging for analysis of 0.13-micron and silicon on insulator (SOI) devices.

As a device is stimulated by signals applied in a repetitive test loop, the PICA system detects individual photons emitted when a CMOS transistor switches, and records the time and position of each photon. Accumulation of single photon events produces accurate timing information which can be compared directly to electrical simulation for electrical analysis. Possible timing measurements include propagation delay, clock skew and signal tracing across multiple devices from a single probing session. Photon emission data from every node in the field of view over the entire test loop are collected and stored. With or without circuit layout information, multi-node probing requires less time and resources than focused or spot beam probing. Passive emission measurement schemes enable unattended probe operations. The data can be remotely accessed and viewed for example as histogram graphs or movies. Multiple researchers can simultaneously analyze the data, each at a stand-alone workstation, extracting timing information and creating histogram graphs and/or signal flow "movies".

The IDS® PICA system includes a laser scanning microscope (LSM) with navigation software allowing a user to view the LSM device image during acquisition and overlay the PICA emission data with computer-aided-design (CAD) alignment tools. A PICA software tool allows a user to create channels around individual nodes of the IC device or produce dynamic movies for intuitive fault localization. A histogram software tool allows a user to create transition-timing information for specified areas (channels) defined in the PICA tool.

Incorporated by this reference are the following additional documents describing optical probing: G. DAJEE et al., Practical, *Non-Invasive Optical Probing for Flip-Chip Devices*, ITC INTERNATIONAL TEST CONFERENCE, Paper 15.3, 2001, pages 433–442; and N. GOLDBLATT et al., *Unique and Practical IC Timing Analysis Tool Utilizing Intrinsic Photon Emission*, MICROELECTRONICS RELIABILITY 41 (2001) 1507–1512.

Figure 1:
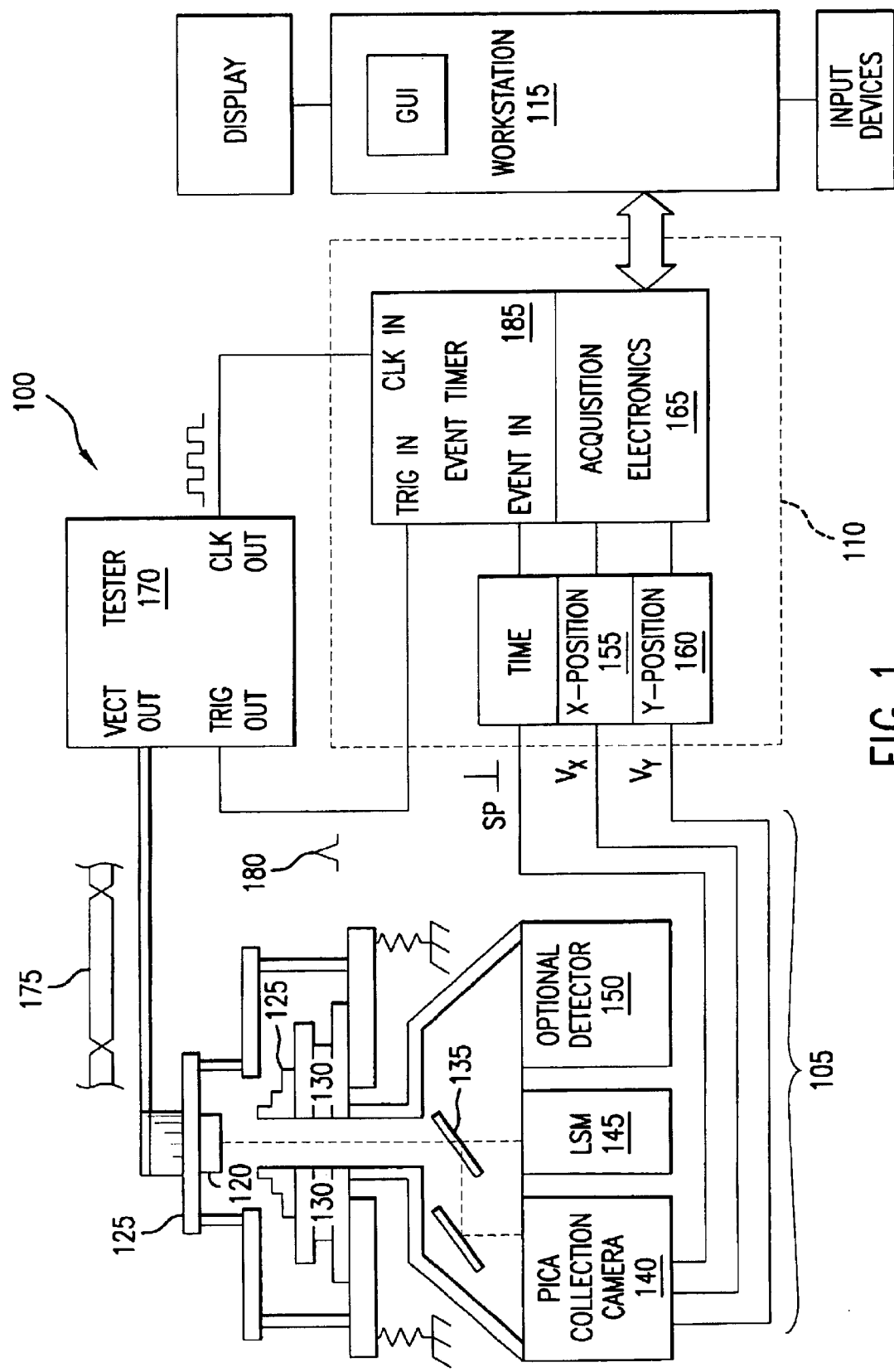
FIG. 1 shows a schematic block diagram of a PICA system.

FIG. 1 shows a schematic block diagram of a PICA system 100 having a PICA frame 105, an electronics rack 110 housing signal acquisition and timing electronics, and a workstation 115 having a display and input devices enabling a user to interact with PICA system 100. A device under test (DUT) 120 is mounted under a test load board 125 which is in turn mounted at the top of PICA frame 105 onto an optical breadboard. Directly under DUT 120 is an objective lens turret 125, with multiple imaging lenses. Lens turret 125 and the rest of the optical system is carried on a motorized xyz stage 130 allowing DUT 120 to remain stationary while the optics are moved. A lens and mirror assembly 135 mounted on the underside of stage 130 allows selection of one of several optical paths. One optical path is for a PICA collection camera 140, a second is for a laser-scanning microscope (LSM) 145 used for device navigation and correlation to CAD data, and a third port is provided for a optional further detector 150.

PICA collection camera 140 converts incident photons into electrical signals, with voltage levels Vx and Vy representing the x,y position of a detected photon and a strobe pulse SP synchronized to the time of arrival of the photon regardless of its x,y position. Voltage levels Vx and Vy are supplied to x-position and y-position processing electronics 155, 160 which capture levels Vx and Vy at the time of a strobe pulse SP and convert them to digital position values. The digital position values, along with timing information, are collected in an acquisition module 165 for transfer to workstation 115 where they can be stored, analyzed and displayed. Each detected-photon event can be assigned an address representing its x,y position and time of arrival. Workstation 115 includes a graphical user interface (GUI) and other software allowing the user to control the acquisition of data and subsequent data display and analysis.

LSM 145 is a high-resolution infrared imaging microscope for generating images through the backside of DUT 120. The LSM image can be used to navigate around DUT 120, and can be linked to a CAD layout of DUT 12, enabling each emission event to be related to the chip architecture and as needed back to the design schematic. The LSM image is also linked to the detection region of the PICA camera. Because they share nearly the same optical path, a single mirror can be used to switch between navigation mode (using the LSM) and data acquisition mode (using the PICA camera). A software-based adjustment technique corrects for small offsets in the two image planes, providing accurate registration between the emission data and the corresponding LSM image.

The PICA camera tends to have a slight spatial non-linearity. If the non-linearity is not corrected, a LSM image and a PICA image overlapping in the center of the field of view can be off near the edge of the field of view. The system includes software to map a correction matrix to compensate for the distortion. Once the desired area on the DUT is found using the real-time image from the LSM, a mirror is brought into place which relays the exact same field of view to the imaging plane of a single photon imaging detector camera. Using a 100× objective, the field of view is, for example, 160 µm. Larger fields of view can be chose by selecting a lower-power objective from the objective turret.

A tester 170 stimulates DUT 120 with a repetitive test-vector pattern 175 from a vector output port (vect out). Each repetition of test-vector pattern 175 is marked by a trigger pulse 180 supplied from a trigger output port (trig out) of tester 170 to an input port (trig in) of an event timer 185. A tester clock signal 190 may also be supplied from tester 170 to event timer 185. Event timer 185 measures the delay between a photon arrival event, which can occur at any time within the test-vector pattern, and the start (or end) of the test-vector pattern. Trigger pulses 180 serve to start or stop event timer 185, depending on which of two data-acquisition modes is employed. In either mode, photon-detection events are referenced to the test-trigger pulses 180. The first data-acquisition mode employs the strobe pulses SP to start event timer 185 and the trigger pulses 180 to stop event timer 185. In this mode hardware and software overhead are reduced as no processing is initiated until a photon is detected. This mode is useful for relative timing measurements when transistor switching events within DUT 120 are to be measured relative to each other such as when a timing-path error needs to be analyzed. The second data-acquisition mode employs the trigger pulses 180 to start event timer 185 and the strobe pulses SP to stop event timer 185.

Figure 2:
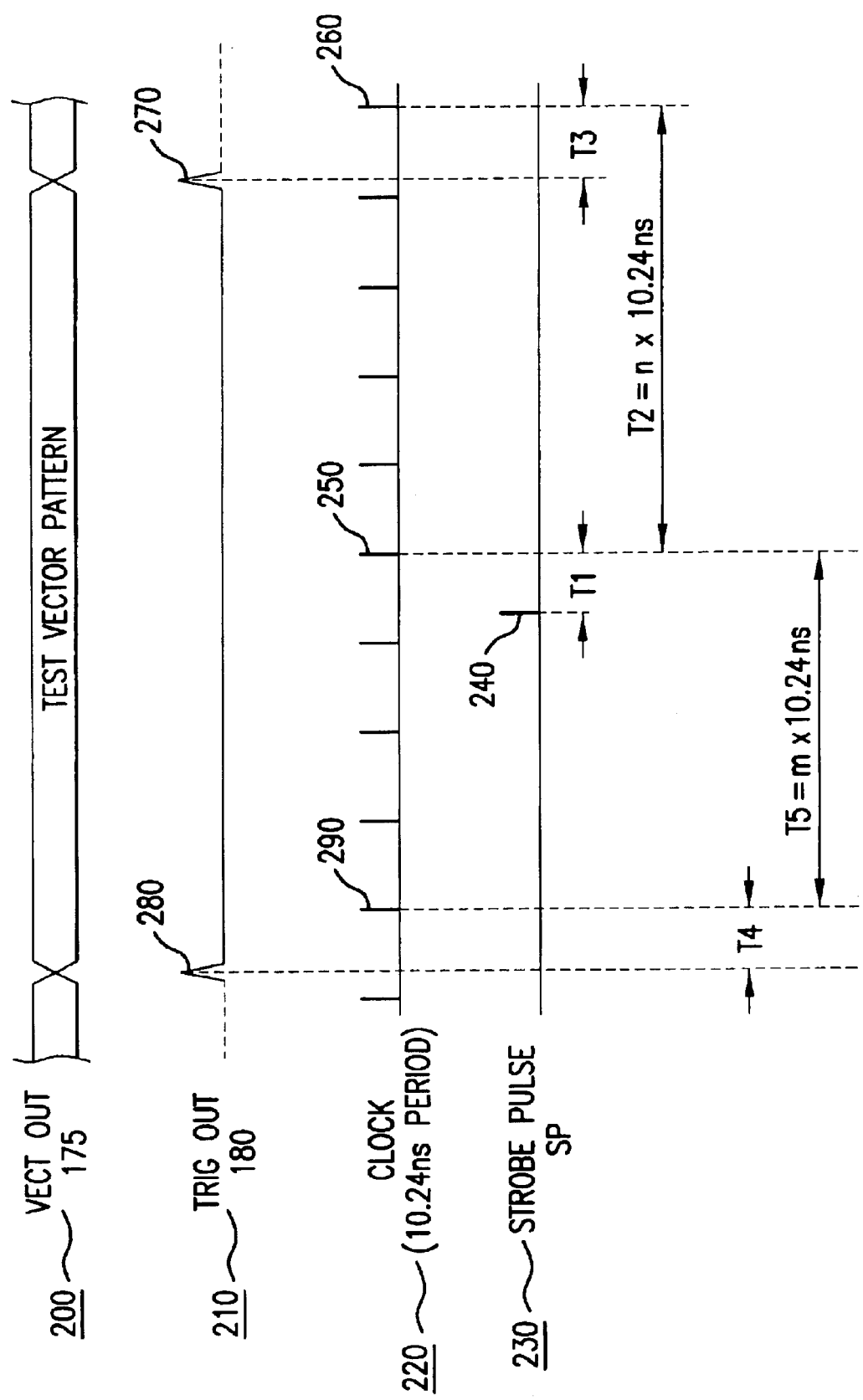
FIG. 2 schematically illustrates two data acquisition modes of a PICA system.

FIG. 2 schematically illustrates the two data-acquisition modes. Line 200 shows a repetitive test-vector pattern 175. Line 210 shows periodic trigger pulses 180 marking the beginning of each repetition of test-vector pattern 175. Line 220 shows a train of clock pulses having, for example, a frequency of 97.65625 MHz and a period of 10.24 ns, which may be phase-locked to a clock signal supplied to event timer 185 from tester 170.

Line 230 shows a strobe-pulse arrival 240. The time from strobe-pulse arrival 240 until the next-occurring clock pulse 250 is shown as T1. The time from clock pulse 250 until the first clock pulse 260 to occur after the next trigger pulse 270 is shown as T2, and is an integer number n of periods of the clock pulse train. The time from trigger pulse 270 to clock pulse 260 is T3. In the first data-acquisition mode, event timer 185 measures time intervals T1, T2 and T3 so that the relative time between strobe-pulse arrival 240 and trigger pulse 270 can be determined as T1+T2−T3, e.g., in workstation 115.

The time from a trigger pulse 280 marking the start of a test-vector pattern until the next-occurring clock pulse 290 is shown as T4. The time from clock pulse 290 until the first clock pulse 250 to occur after a strobe-pulse arrival 240 is shown as T5, and is an integer number m of periods of the clock pulse train. In the second data-acquisition mode, event timer measures time intervals T4, T5 and T1 so that the relative time between trigger pulse 280 and strobe-pulse arrival 240 can be determined as T4+T5−T1.

Figure 3:
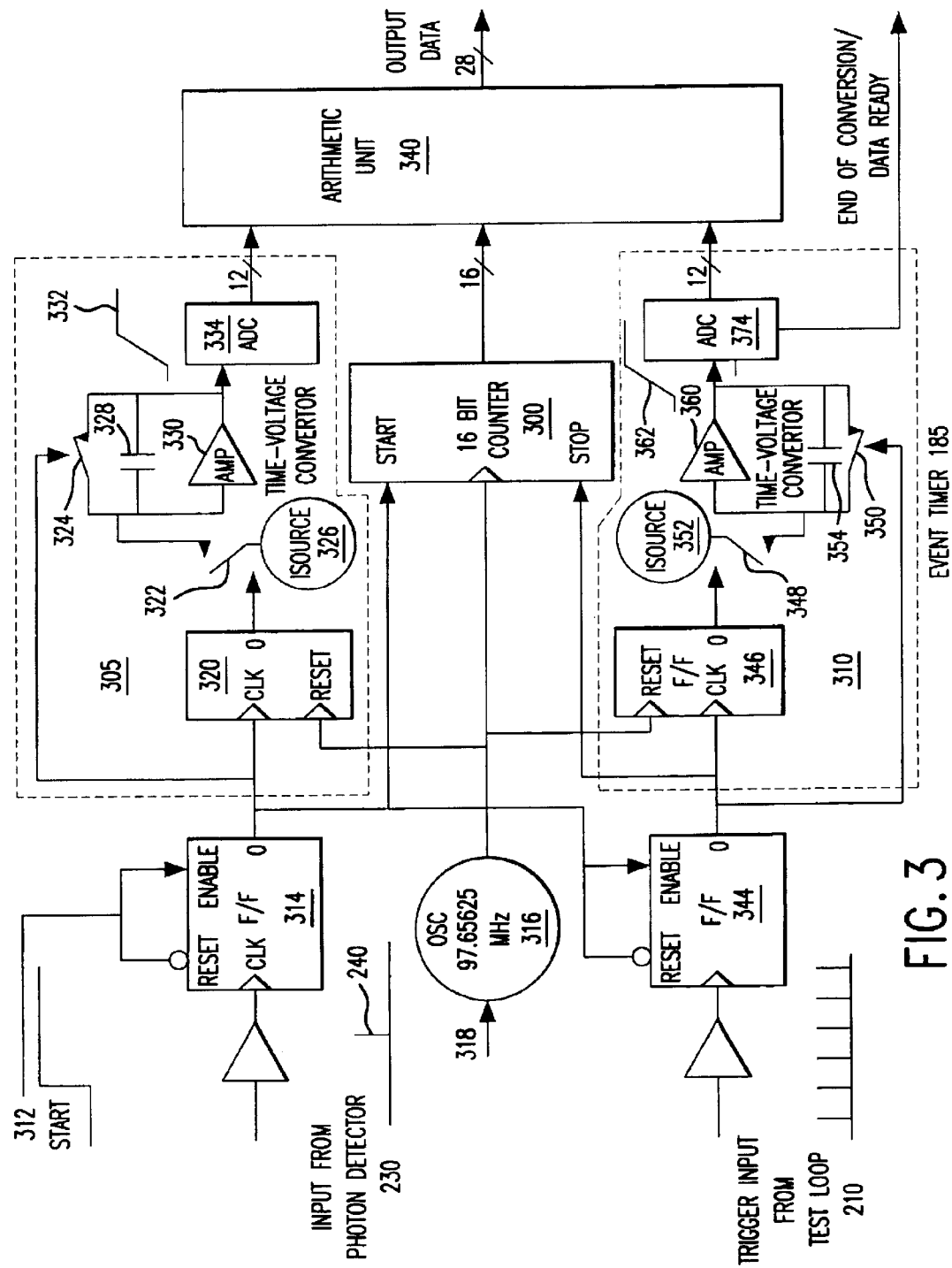
FIG. 3 shows a simplified schematic an event timer of a PICA system.

FIG. 3 shows a simplified schematic embodiment of an event timer 185 configured for the first data-acquisition mode in which time is measured from a strobe-pulse arrival 240 to the succeeding trigger input 270. The timing measurement is carried out by a coarse-timing counter 300 which counts the integer number of clock pulses representing interval T2, and a pair of fine-timing interpolators 305, 310 which measure respectively the interval T1 from strobe-pulse arrival 240 to the next-occurring clock pulse 250, and interval T3 from the subsequent trigger pulse 270 to the next-occurring clock pulse 260. Each of the fine timing portion interpolators in this embodiment includes a time-to-voltage converter (TVC) and is optimized, e.g., for measuring delays of $\leq 10.24$ ns.

A start signal 312 enables a flip-flip 314 which receives the strobe-pulse input from PICA data collection camera 140. When a strobe-pulse arrival, e.g., 240, is received at the clock input of flip-flop 314, the Q output of flip-flop 314 goes high. This causes counter 300 to start counting clock pulses from a clock source 316, such as clock pulses with a 10.24 ns period from a 97.65625 MHz oscillator. Clock source 316 may be phase-locked to the clk out signal from tester 170 as indicated by input arrow 318. The high output of flip-flop 314 also clocks a flip-flop 320 in TVC 305, which in turn closes a controllable switch 322 and opens controllable switch 324. Constant-current source 326 feeds current via switch 322 to charge capacitor 328 at a constant rate. The output voltage from amplifier 330 ramps up at a constant rate as shown at 332 until flip-flop 320 is reset by the next-occurring clock pulse, e.g., by clock pulse 250. The voltage at the output of amplifier 330 is then sampled by an analog-to-digital converter ADC 334 and the digitized value is passed to an arithmetic unit 340.

The high Q-output of flip-flop 314 also enables a flip-flop 344 so that a stop signal is sent to counter 300 on the next-occurring trigger pulse, e.g., trigger pulse 270. The count from counter 300 is passed to arithmetic unit 340. The high Q-output of flip-flop 314 also enables the output of a flip-flop 346 in TVC 310 to be set high by the next-occurring trigger pulse, e.g., trigger pulse 270. The high output of flip-flop 346 closes a controllable switch 348 and opens controllable switch 350 so that constant-current source 352 feeds current via switch 348 to charge capacitor 354 at a constant rate. The output voltage from amplifier 360 ramps up at a constant rate as shown at 362 until flip-flop 346 is reset by the next-occurring clock pulse, e.g., by clock pulse 260. The voltage at the output of amplifier 360 is then sampled by an analog-to-digital converter ADC 374 and the digitized value is passed to arithmetic unit 340.

When ADC 374 has passed its value to arithmetic unit 340, it signals that a timing data set from event timer 185 is ready for conversion to a time value. The value passed from ADC 334 corresponds to time T1 of FIG. 2. The count passed from counter 300 is an integer number of clock periods corresponding to time T2 of FIG. 2. The value passed from ADC 374 corresponds to time T3 of FIG. 2. Thus, arithmetic unit 340 can determine the time from a strobe pulse 240 to the next-occurring trigger pulse 270 according to the relation T1+T2−T3, so that the time of the photon-detection event is known relative to the trigger pulse of the repetitive test pattern applied to DUT 120. Timing accuracy is independent of the arrival time of the photon within the test pattern. Coarse-timing counter 300 has, for example, 16 bits of resolution and fine-timing TVCs 305, 310 each have, for example, 12 bits of resolution. With a minimum time increment of 2.5 ps a maximum hardware loop time is ~671 $\mu$s.

The embodiment shown in FIG. 3 can be modified to operate in the second data-acquisition mode (e.g, timing from a trigger pulse 280 to a strobe pulse 240 as described above with reference to FIG. 2), by applying the trigger signal 220

Clock source 316 can be phase-locked to a clock signal provided by tester 170 for tight synchronization of event timer 185 with tester 170. This "slave" mode of the system is particularly useful to compensate for long-term drifts in the tester clock. However, the system can also run without actively locking to the tester clock because the timing by design is always relative to the tester trigger edge, as described above.

FIG. 4 schematically shows a time-to-voltage interpolator 400. FIG. 5 is a timing diagram illustrating its operation. Switch 410 is initially closed so that capacitor 420 is discharged, and switch 430 is open so that no current is supplied from constant-current source 440 to amplifier 450. When an interval is to be timed, such as the interval from a strobe pulse 240 to the next-occurring clock pulse 250, switch 410 is opened as shown at 550 and switch 430 is closed as shown at 560, allowing current from source 440 to charge up capacitor 420. The voltage Vout at the output of amplifier 450 ramps up as shown at 570. When the timing-termination event is detected, e.g., clock pulse 250, switch 430 is opened as shown at 580 so that the voltage Vout at the output of amplifier 450 remains constant until switch 410 is again closed at some later time 590.

FIG. 6 schematically shows an alternate embodiment of a time-to-voltage interpolator 600 having a constant-current source 610 and a controllable current source 620. Switches 630 and 640 are initially closed so that current flows to ground rather than to capacitor 650. When an interval is to be timed, such as the interval from a strobe pulse to the next-occurring clock pulse 250, switch 640 is opened as shown at 750, allowing current from source 610 to charge up capacitor 650 across amplifier 660. The voltage Vout at the output of amplifier 670 ramps up as shown at 760. When the timing-termination event is detected, e.g., clock pulse 250, switch 630 is opened as shown at 770 so that the voltage Vout at the output of amplifier 660 remains constant until switches 630 and 640 are again closed at some later time 790 to reset the output to zero. With switches 630 and 640 closed, any voltage at the output of amplifier 660 is supplied to an input of error amplifier 670, so that an error signal is applied from error amplifier 670 to controllable current source 620, assuring that the output voltage Vout remains at zero until an event is to be timed. Such a circuit provides a stable and adjustable feedback loop in which the current source can be cleanly switched or passed to ground.

Figure 8:
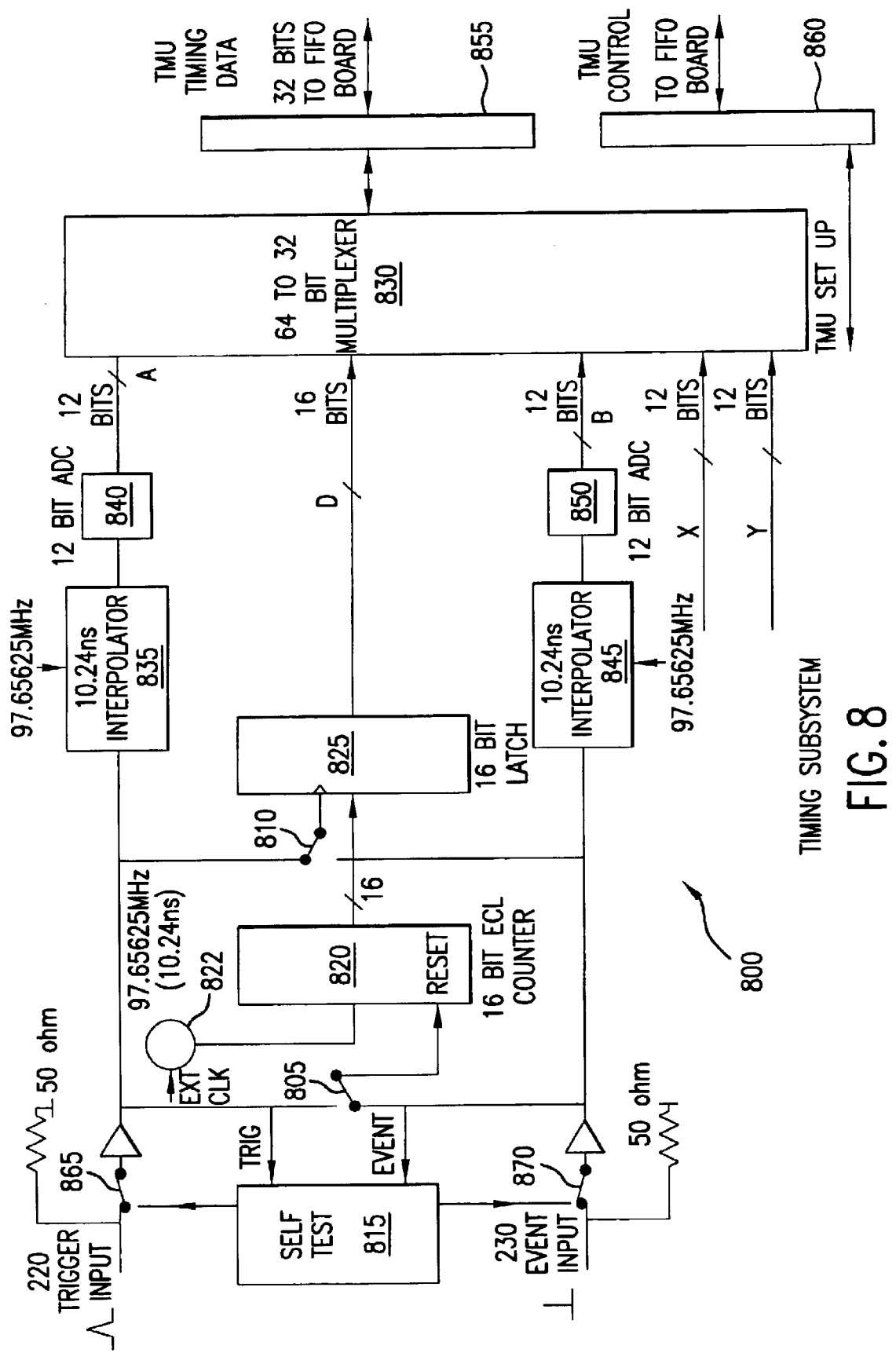
FIG. 8 is a schematic diagram of a timing subsystem of a PICA system.

FIG. 8 shows at 800 a timing subsystem including portions of acquisition electronics 165 and including functional elements of event timer 185. Mode switches 805, 810 provide for selecting between the first and second data-acquisition modes described above. A self-test section 815 is described in more detail below. In operation, and with switches 805 and 810 in the indicated positions, coarse-timing counter 820 is reset by the event input (e.g., on arrival of a strobe pulse 240) and will thus count clock pulses occurring after a strobe pulse. The coarse-timing count is read by a latch 825 on the next-occurring trigger pulse (e.g., trigger pulse 270) and passed to a multiplexer 830. A time-to-voltage interpolator 835, e.g., as in FIG. 4 or FIG. 6 or of other suitable design, supplies a voltage representing time from a trigger pulse to the next-occurring clock pulse (e.g., time T3 from trigger pulse 270 to clock pulse 260). The output of interpolator 835 is digitized by an analog-to-digital converter (ADC) 840 and passed to multiplexer 830. A time-to-voltage interpolator 845, e.g., as in FIG. 4 or FIG. 6 or of other suitable design, supplies a voltage representing time from an event input to the next-occurring clock pulse (e.g., time T1 from strobe pulse 230 to clock pulse 250). The output of interpolator 845 is digitized by an ADC 850 and passed to multiplexer 830. In addition to the trigger input and strobe (event) input, timing subsystem 800 optionally receives digitized x- and y-position values corresponding respectively to voltages Vx and Vy of FIG. 1, and optionally receives an external clock signal such as the clk out signal from tester 170. The x- and y-position values are used for PICA mode of operation, but are not needed in a time-resolved emission (TRE) mode.

Figure 9:
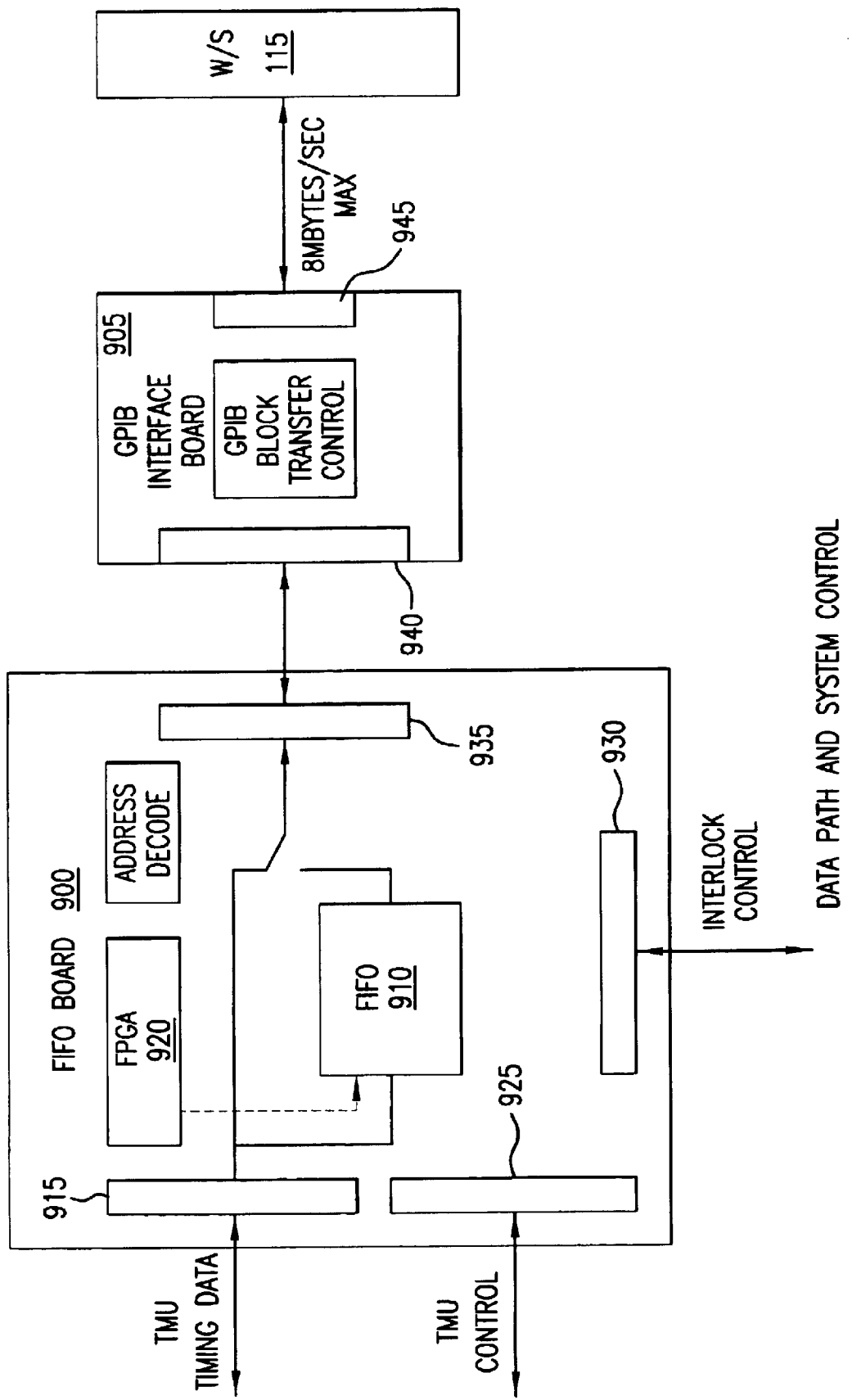
FIG. 9 is a schematic diagram of the data path and system control of a PICA system.

Data from multiplexer 830, which forms part of acquisition electronics 165, are passed via a connector 855 to a first-in-first-out (FIFO) circuit board shown in FIG. 9. These data include, e.g, 64 bits of data in two 32-bit words comprising: (a) 16-bit output from counter 820 representing a number of 10.24 ns periods, (b) 12-bit output from interpolator 835 with a full-scale of 10.2 4 ns, (c) 12-bit output from interpolator 835 with a full-scale of 10.24 ns, (d) flags signaling end of conversion for x,y, trigger and event, and (e) trigger and event odd/even flags. The timing subsystem of FIG. 8 further includes a connector 860 for communication via the FIFO circuit board between timing subsystem 800 and workstation 115. This allows a user to set up and control the timing subsystem from workstation 115, including control of acquisition-mode switches 805, 810 and of setup and calibration processes for interpolators 835, 845 as described below.

FIG. 9 is a simplified schematic of the data path and system control, including FIFO board 900 and a GPIB interface board 905 serving to control transfer of data blocks between FIFO board 900 and workstation 115. Timing data from multiplexer 830, and x,y photon event data, are received and stored in a FIFO memory 910 via connectors 855 and 915 under control of FPGA 920. These data are read by workstation 115, for example, via a high-speed GPIB data bus as interrupt-driven DMA data burst. FIFO board 900 also communicates with the timing subsystem via connectors 860 and 925, with an interlock circuit board shown in FIG. 10 via connector 930 and with workstation 115 via GPIB interface board 905 and connectors 935, 940, 945. Suitable communications elements and techniques are well-known in the art and need not be detailed here.

Figure 10:
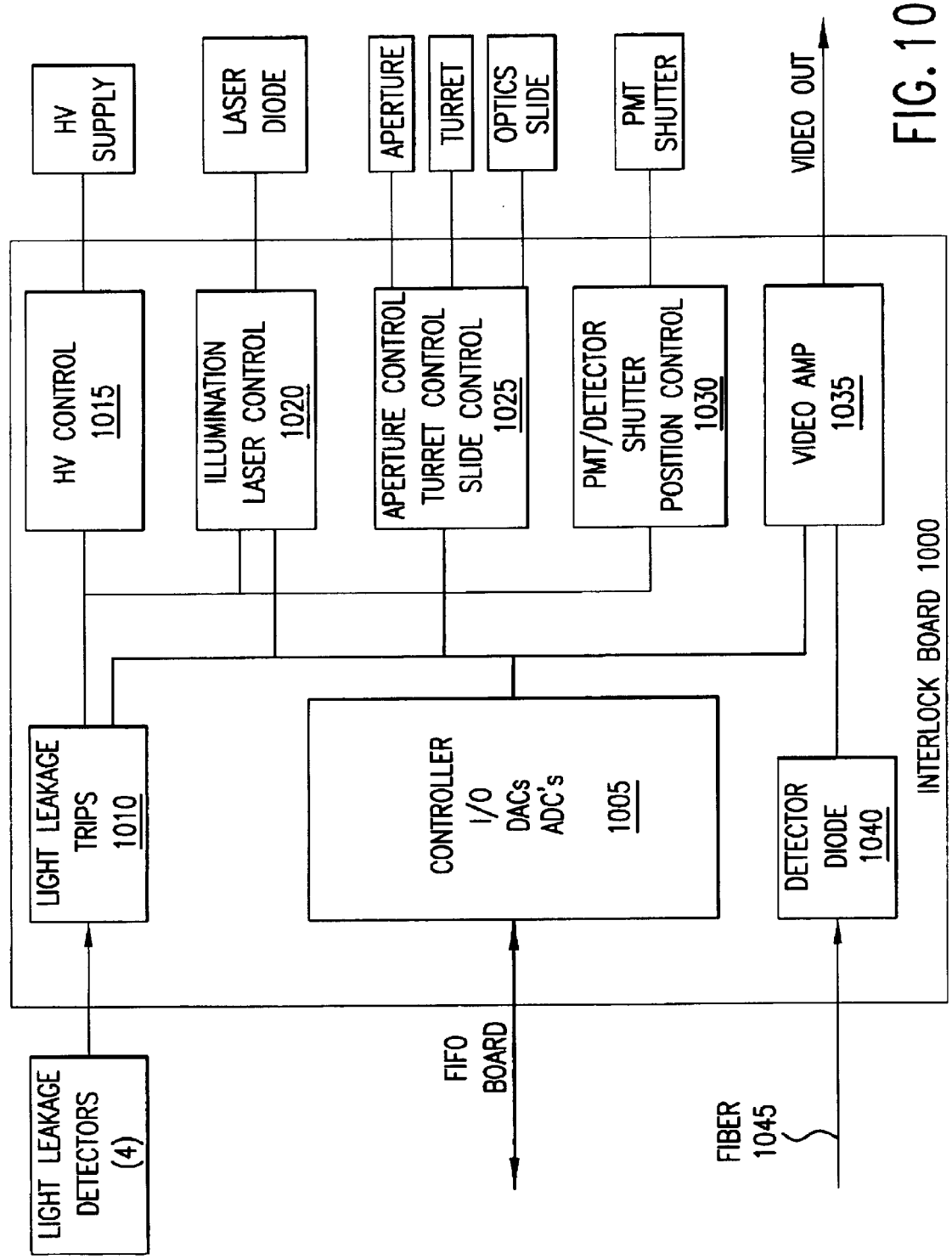
FIG. 10 is a schematic diagram of an interlock circuit board of a PICA system.

FIG. 10 is a simplified schematic of an interlock circuit board 1000 having control of the elements in PICA frame 105 An input/output controller 1005 communicates via FIFO board 900 with workstation 115 so that system operation can be commanded and monitored by a user from workstation 115. Controller 1005 includes input-output elements, DACs and ADCs for controlling light-leakage trips 1010 supplied by a high-voltage (HV) control 1015, an illumination laser control 1020, aperture/turret/slide controls 1025, a photomultiplier-tube (PMT) detector shutter position control 1030, and a video amplifier 1035 whose input is fed from a detector diode 1040 for detecting emissions photon-arrival events transmitted by an optical fiber 1045.

In the first data-acquisition mode, event timer 185 (e.g., as in FIG. 3 or FIG. 8) starts timing on a photon-arrival event (e.g., strobe pulse 240) and stops following the next trigger (e.g., trigger pulse 270). After the data for timing measurement of that event has been transferred (e.g., to FIFO 910), event timer 185 awaits an acknowledgment signal (e.g., an ACK signal from FIFO board 900) which prepares the timing-measurement subsystem for timing a subsequent event. When the event circuit is activated by an incoming event (e.g. strobe pulse 240), an inhibit is removed from the trigger path, and further activation of the event circuit is inhibited. The clock-pulse counter (e.g. counter 820) is zeroed and then runs until a trigger (e.g., trigger pulse 270) is detected. Further activation of the trigger circuit is then again inhibited. The FIFO board monitors the end of convert (EOC) flags signaling that the measurement data for this event is ready, and on receiving the required flags (depending on whether in TRE or PICA mode), requests transfer of the data, e.g., of the 64-bit data on the 32-bit timing data bus in two cycles. The FIFO board then issues an acknowledgment signal which removes the inhibit from the event circuit, and the cycle repeats. This mode is typically used when far more triggers (e.g., trigger pulses 210) than events (e.g., strobe pulses 230) are expected, which is generally the case when the test loop (e.g., test vector pattern 200) is less than about 50 µs.

In the second data-acquisition mode, event timer 185 (e.g., as in FIG. 3 or FIG. 8) starts timing following a trigger (e.g., trigger pulse 280) and presents event data on-the-fly after each event (e.g., as set of measurement data after each strobe pulse), resetting with the next trigger (e.g., trigger pulse 270). When the trigger circuit is activated by an incoming event (e.g. trigger pulse 280), the clock-pulse counter (e.g., counter 820) is zeroed and runs until the next trigger (e.g., trigger pulse 270) when it is zeroed again. The event path is always enabled, except for a period of, e.g., 500 ns, following activation by an event. Each accepted event produces new interpolator and counter data. To avoid ambiguity that can arise when trigger and event occur almost simultaneously, event data and trigger data can be tagged with a trigger-period odd/even flag. The FIFO (e.g., FIFO 910) monitors the end-of-convert flag (EOC) for the event, and x and y, obtains the data and then sends its acknowledgment (ACK). The FIFO takes account of changing trigger data by monitoring the EOC flag for trigger data. This second data-acquisition mode may be useful for long trigger periods, e.g., greater than about 50 µs.

The time record of photons emitted from the same DUT logic transition (absolute time position) will change if the DUT clock frequency changes during the record time. This effect can be mitigated by using the DUT clock (e.g. the clk out signal from tester 170) as a master time reference for the timing subsystem (event timer). For example, external frequencies from 10 MHz to 200 MHz can be applied in 1 MHz steps, avoiding fractional frequencies. A divide-by-4 circuit may be inserted in the external clock path to accommodate external clock frequencies above 200 MHz so that an applied external clock frequency in the 200 MHz to 400 MHz will leave an integer value when divided by 4.

Figure 11:
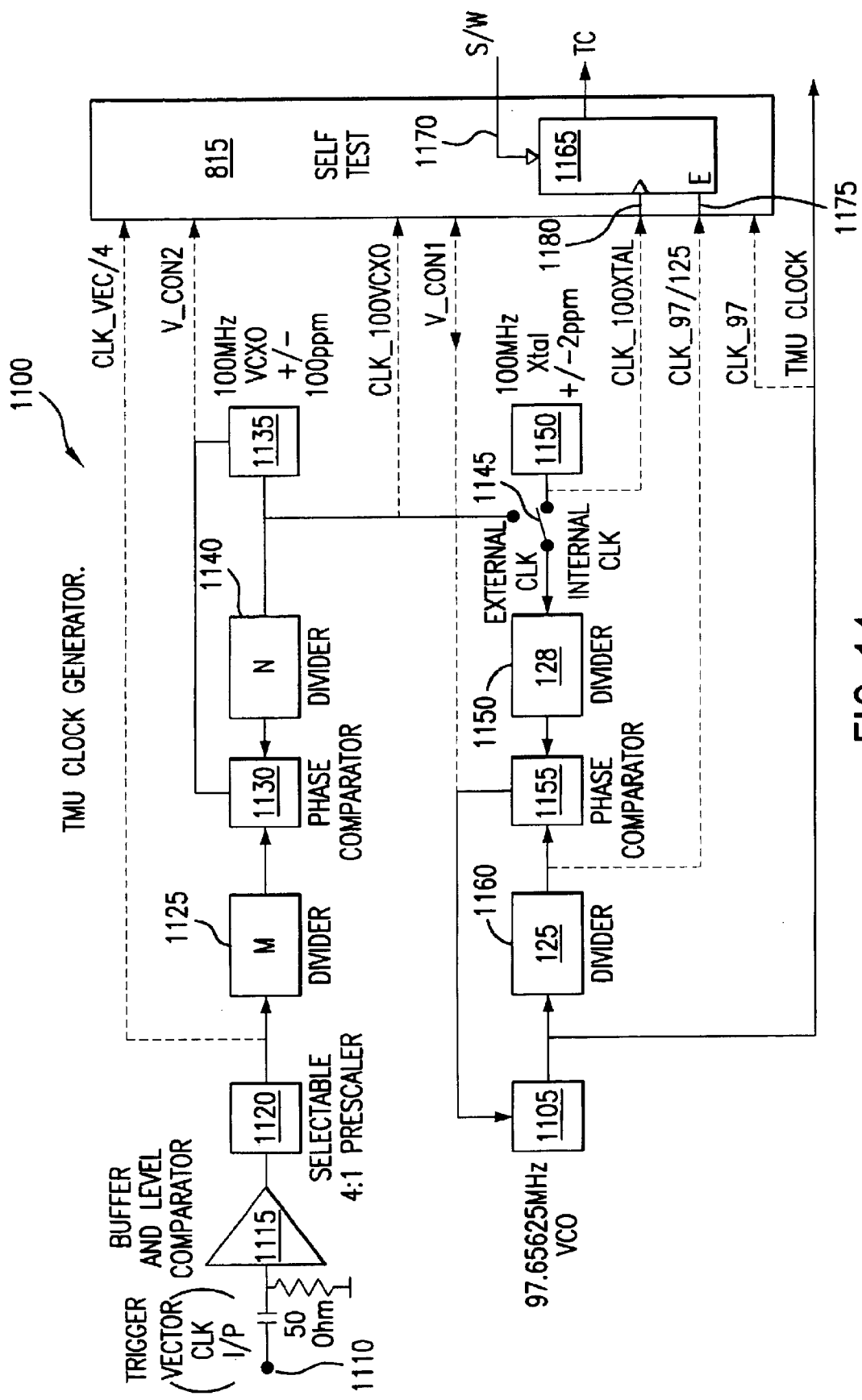
FIG. 11 is a schematic diagram of a timing-subsystem clock generator.

FIG. 11 is a simplified schematic of a timing subsystem (TMU) clock generator 1100 which includes a clock-signal generator 1105 serving the role of clock-signal generators 316, 820. Timing subsystem 1100 also provides an external-clock-source input 1110 with a buffer and level comparator 1115, e.g., for receiving a trigger-signal 210 from tester 170, and an optional selectable 4:1 prescaler 1120 which can be configured to divide the signal applied to input 1110 by four and supply the resulting signal CLK_VEC/4 to self test unit 815 and to a divide-by-M circuit 1125 whose output is passed to a phase comparator 1130. A voltage-controlled crystal oscillator 1135 supplies an internal clock signal, e.g., of 100 MHz, to a divide-by-N circuit 1140 whose output is passed to phase comparator 1130. Phase comparator 1130 serves to lock the phase of oscillator 1135 to the external signal applied to input 1110 in a first phase-locked loop, serving as an external-clock reference available at one pole of switch 1145.

A crystal oscillator 1150 serves as a calibration reference available at a second pole of switch 1145. The output of voltage-controlled oscillator 1105 serves as the timing-measurement-unit TMU clock signal, e.g., the 97.65625 MHz (10.24 ns) signal supplied to counter 300 and interpolators 305, 301 or counter 820 and interpolators 835, 845. Depending on the setting of switch 1145, the output of oscillator 1105 is phase-locked to either the external-clock reference from oscillator 1135 or the calibration reference from oscillator 1150; the reference selected at switch 1145 is passed through a divider 1150 to a phase comparator 1155, the TMU clock signal from oscillator 1105 is passed through a divider 1160 to phase comparator 1155, and the phase-comparator output signal is used to control oscillator 115. For example, if oscillator 1105 produces a TMU clock signal at 97.65625 MHz and oscillator 1150 provides a calibration reference signal at 100 MHz (10 ns), and divider 1160 divides by 125 and divider 1150 divides by 128, then phase comparator 1155 receives nominally the same frequency at both inputs and its output will maintain the output of oscillator 1105 in relation to the output of oscillator 1150.

Self-test unit 815 includes a test-signal counter 1165 which can be set by inserting a total-count value at a port 1170, e.g., under software control from workstation 115. Test-signal counter 1165 is enabled by the divided clock signal from divider 1160 on an enable port 1175, and is incremented (or decremented) by the reference signal from oscillator 1150 applied to port 1180. When a number of clock edges corresponding to the total count value has been applied to counter 1165 while it is enabled, counter 1165 supplies a total-count TC signal to indicated that a pre-set interval has been reached. The total-count value inserted in counter 1165 represents a predetermined time delay, e.g., a predetermined multiple of periods of the reference signal from oscillator 1150.

The interpolators are calibrated as described below. The offset and slope of interpolator ramps are set to mid-scale. The trigger and event trip voltage levels are set to approximately the mid-point of the voltage swing applied to those inputs.

A function of clock generator 1100, in addition to serving as a system check, is to allow calibration of the interpolator ramp circuits. To calibrate an interpolator ramp, clock generator 1100 produces on the TMU clock output a repeating signal, e.g., of 5.12 μs period, and from the self-test unit the TC signal whose relative delay can be adjusted by software. Either of these signals can be applied to the trigger or event channels of the timing subsystem, e.g., to interpolator 835 via switch 865 or to interpolator 845 via switch 870 in timing subsystem 800 of FIG. 8. By adjusting the pulse delay and collecting data, an exact measurement of the interpolator slope and offset can be made. Externally-applied event and trigger signals are turned off and switches, e.g., switches 865, 870, are activated to connect the event and trigger channels to the self-test clock generator. The generator is set up so that the event interpolator (e.g., interpolator 845) is always started in the same, but arbitrary, position but the trigger interpolator (e.g., interpolator 835) is started in different positions as the pulse count of the test-clock generator is changed to examine or calibrate the trigger interpolator ramp.

To set up for calibration of the interpolator ramps, test-signal generator 1100 is turned on with the 5.12 μs signal applied to the event and trigger inputs (e.g. of timing subsystem 800), with both levels set, positive slope for trigger input, and negative slope for event input. This arrangement fires the trigger ramp as soon as possible after the event ramp has started. The self-test is configured so that the event interpolator (e.g., 845) is always stopped at the same voltage, but the trigger interpolator (e.g., 835) is stopped at a different voltage as the self-test delay setting is changed. This allows the slope, offset and linearity of the trigger interpolator ramp to be examined. The interpolator slope and offset digital-to-analog converters are set to mid scale, and then ramp voltage measurements are taken at a series of time points. When the self-test generator is set up, the timing subsystem generates a new data point immediately after the FIFO board has read the last value and acknowledged with an ACK. So at any test generator setting a continuous stream of virtually identical data is sent to the workstation as long as the FIFO keeps accepting data from the timing subsystem.

Figure 12:
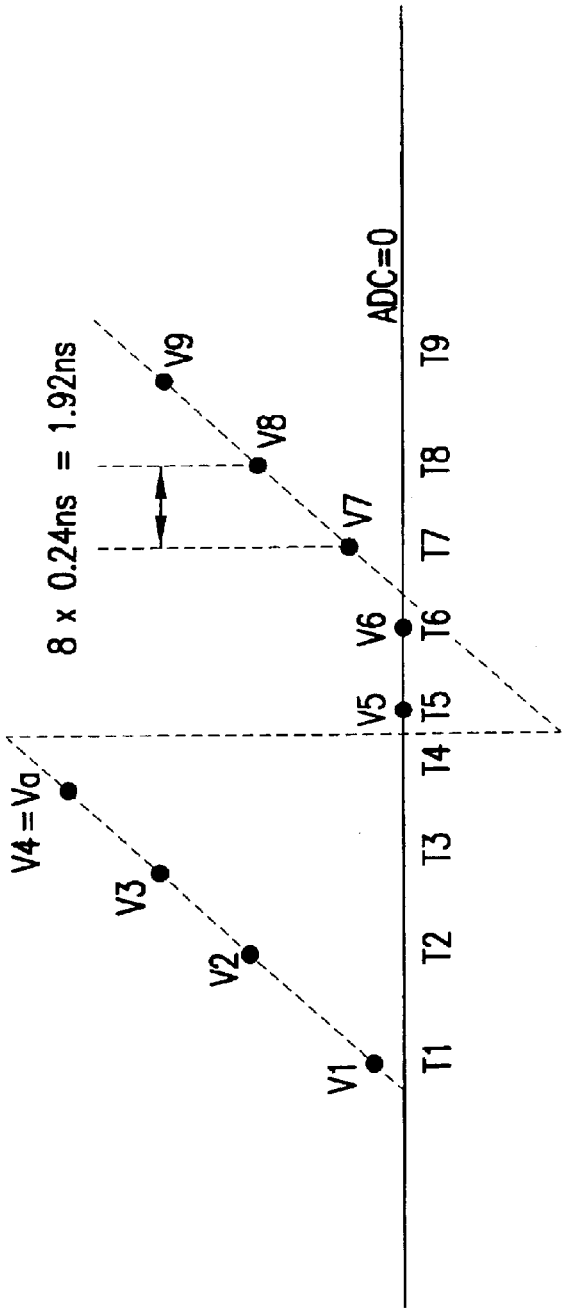
FIG. 12 illustrates a first part of a procedure for interpolator ramp calibration.

As part of the interpolator ramp calibration, a procedure is carried out to adjust phase relative to the boundaries between coarse-measurement intervals, e.g., the 10.24 ns intervals counted by counter 820. FIG. 12 illustrates. An initial delay is set to make a ramp voltage measurement V1 and this is transferred, e.g., to FIFO 910 which sends an ACK and moves the data to workstation 115. The data representing the trigger ramp interpolator ADC voltage is split out and the value of the least-significant bit (LSB) of the coarse time counter is noted. (In the example described, the LSB value is 10240 ps/4096 or 2.5 ps, so that interpolator resolution is 1 in 4096 or 2.5 ps—this gives histogram bin sizes of 2.5 ps×INTEGER.) The delay is reset to make a ramp voltage measurement V2 which is some increment (e.g., 1.92 ns) later than V1. Voltage measurement V2 is likewise transferred and the value of the LSB of the coarse time counter is noted. The procedure is repeated with delays reset in increments (e.g., of 1.92 ns) to make and record a series of ramp voltage measurements, e.g., 15 voltage measurements V1–V15 defining 14 periods of 8×0.24 ns=1.92 ns each and covering a total of 26.88 ns. The LSB of the coarse counter will be constant (say 0) for one period of, e.g., 10 ns, then change (say 1) as the set delay goes into the next period of, e.g., 10 ns. The voltages recorded, e.g., V1 to V15, show the same cycle, e.g., of 10 ns, except that before calibration the ADC may give readings of 0 or full scale for one or more of these. As shown in the example of FIG. 12, voltage measurements V1–V4 are within one 10 ns period in which the LSB of the coarse counter is 1, voltage measurements V5–V9 are withing a subsequent 10 ns period in which the LSB of the coarse counter is 0, and measurements V5 and V6 are zero because the ramp is below interpolator's ADC range at those measurement times.

In the example, the hardware range of the offset is restricted so that of the minimum of 5 voltage readings (at 1.92 ns intervals) that fall within one 10 ns cycle at least 3 of them will not be at the limit (0 or full scale) of the ADC. For the data points V1 to V15, and starting at V1, software identifies which is the first data point before the coarse counter LSB increments. Call this Va, which in the example of FIG. 12 is sample V4. A DAC whose output can adjust the delay of the calibration pulses in very small time steps, much smaller than the 0.24 ns steps available by changing the setting of the calibration counter, can be set to align data point Va exactly with the LSB change of the coarse counter. This is also the point where the interpolator ramp changes from its most positive to its most negative value.

Figure 13:
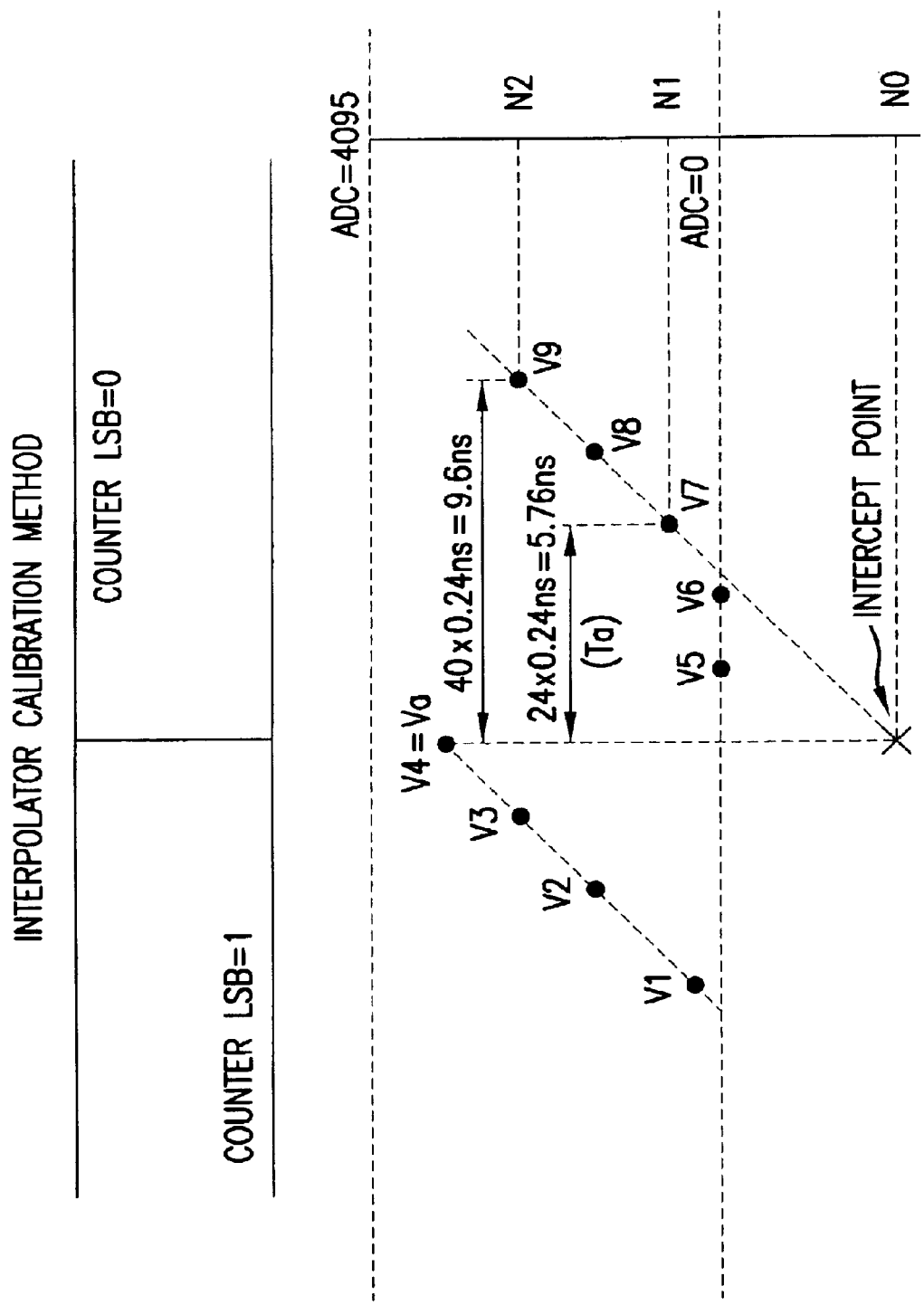
FIG. 13 illustrates a second part of a procedure for interpolator ramp calibration.

The following routine determines the setting needed align data point Va exactly with the LSB change of the coarse counter corresponding to the coarse-measurement interval boundary. FIG. 12 shows the first data set plotted against equivalent time. The dashed line shows a possible starting position of the interpolator ramp. The highest and lowest data points may be at the limits of the ADC. In the diagram, measurement V4 has been found to be Va. Using the coarse counter LSB value as an indicator, and changing the delay in small increments, a binary search is performed to identify the ramp/counter transition. The offset is adjusted so that Va is aligned exactly with the LSB transition as shown in FIG. 13.

A procedure is then carried out to adjust slope. Starting with the value set for Va, the delay is reset to collect a series of voltage measurements at intervals, e.g., five samples at intervals of 1.92 ns. Any samples which are at the ADC limit (0 or full scale) are discarded, e.g., samples V5 and V6 of FIG. 13. It is acceptable if the first two samples, e.g., V5 and V6 are zero, and all others in range, or if the last two samples are at full scale and all others are in range. After discarding any readings at the ADC limit, between five and three valid data points remain, e.g., samples V7, V8, V9 in FIG. 13, for calculating the ramp slope in bits/ns. The valid points furthest apart in time are preferably used to calculate the ramp slope, e.g., samples V7 and V9 in the example of FIG. 13. The time between consecutive data points is known, e.g., to be 0.24 ns. Preferably DACs controlling the slope are adjusted so that the actual slope will approximate an ideal slope value, the actual slope is again determined in the same manner, and the process is repeated until the actual slope is within predetermined limits of the ideal slope.

FIG. 14 illustrates the timing relationship of signals in measuring the interpolator-ramp slope. Line 1405 shows the clock pulses counted by the coarse-timing counter, e.g., of 97.65625 MHz from TMU clock source 1105. Line 1410 shows the reference clock pulses, e.g. of 100 MHz supplied by oscillator 1150. After each 125 cycles of the 97.65625 MHz signal and 128 cycles of the 100 MHz signal, the signals are exactly aligned. Line 1415 shows the output of the phase-locked-loop indicating when the signals of lines 1405 and 1410 are coincident, e.g., coincident signal CLK_ 97/125 from divider 1160 (1.28 is period) marking the start of the test count by enabling counter 1175 when these signals are exactly aligned. Line 1420 shows a number A of 10 ns cycles counted, e.g., by test counter 1165, after being enabled. Line 1425 shows an interpolator ramp started after A cycles have been counted and stopped at the next clock edge of the signal of line 1405 to take a first ramp-voltage measurement V1, e.g., the ramp is started on the 100 MHz clock edge at which counter 1165 has counted a number A of 10 ns cycles and stops on the next-occurring clock edge of the 97.65625 MHz coarse-timing clock signal.

Line 1430 shows a number A+B of 10 ns cycles counted, e.g., by test counter 1165 after being enabled. (If test counter 1165 is implemented at shown in FIG. 11, it can be enabled during each 1.28 μs period of the PLL output to decrement from a value inserted at port 1170. Thus, measurements V1 and V2 are taken during different periods of the PLL output, but are shown with the start of test counter aligned to indicate timing relative to the PLL period.) Line 1435 shows an interpolator ramp started after A+B cycles have been counted and stopped at the next clock edge of the signal of line 1405 to take a second ramp-voltage measurement V2, e.g., the ramp is started on the 100 MHz clock edge at which counter 1165 has counted a number A+B of 10 ns cycles and stops on the next-occurring clock edge of the 97.65625 MHz coarse-timing clock signal. Because the relative phase of the signals of lines 1405 and 1410 varies during the PLL period, different test-counter counts (such as A and A+B) produce different measurement intervals and thus different ramp-voltage measurements (such as V1 and V2).

While the test signals from oscillator 1150 are synchronized to the timing measurement clock signal from oscillator 1105, the position of the signals relative to the interpolator operation can be changed, e.g., by 0.24 ns for every one pulse (10 ns) change in test generator pulse position. This allows data on the interpolator ramp to be obtained in, e.g., 0.24 ns steps—a possible 42 data points for the 10.24 ns range of the interpolator ramp. For example, if each test-counter increment of 1 represents a virtual time difference of 0.24 ns, then if B is 10, the difference between the measurement times of V1 and V2 will be 2.4 ns and the interpolator-ramp slope is V2−V1/2.4 volts per ns. As the running time of the interpolator ramp is around 10 ns, it fills in between the 10.24 ns counts of the coarse-measurement counter. In the example, the signals on lines 1405 and 1410 are almost in phase after 42 or 86 cycles of the 100 MHz signal, but it takes 128 cycles to get exactly back in phase, so the values of A and B are selected so that measurements V1 and V2 are made in other regions where the signals are more out of phase.

Once phase and slope adjustment are adjusted, offset can be adjusted as indicated in FIG. 13. The "intercept" on the vertical axis can be calculated. If the lower intercept is calculated it is compared to the ideal value (e.g., the ADC lower limit of 0). If the upper intercept is calculated it is compared to the full scale value (e.g., the ADC upper limit of 4095). To calculate the intercept, one of the extreme (valid) data points used in the last actual slope calculation is taken. The exact delay of this point from the true ramp start is known, see FIG. 13. If the data point has an ADC value of N1, and the slope is known from previous calibration to be 400/ns, then:

$$\text{Intercept Value}N0 = \text{Value}N1 - (\text{Time\_of\_}N1 \times 400)$$

The intercept can be positive or negative. ValueN0 is 0. Adjustments are sent, e.g., from software running on workstation 115, to the offset DAC and measurements are taken of the offset N0 to reduce the error in N0, e.g., to less than an equivalent of ±5 ps.

The invention is not limited to the embodiments described. Those of skill in the art will recognize that these and other modifications can be made within the spirit and scope of the invention as defined in the claims.

What is claimed is:

1. A method of calibrating a timer having a coarse measurement capability in which time intervals defined by time-interval boundaries are counted and a fine measurement capability in which time between time-interval boundaries is interpolated using a voltage ramp, comprising:

a. Aligning the voltage ramp relative to the time-interval boundaries;

b. Determining alignment of the voltage ramp relative to a reference-clock signal having a known relationship to the time-interval boundaries;

c. Sampling the voltage ramp at a plurality of known times relative to the time-interval boundaries; and d. Determining slope of the voltage ramp as a function of time from the voltage samples, wherein aligning the voltage ramp comprises starting the voltage ramp at a defined number of periods of the reference-clock signal following coincidence of the interval-clock signal and the reference-clock signal.

2. A method of calibrating a timer having a coarse measurement capability in which time intervals defined by time-interval boundaries are counted and a fine measurement capability in which time between time-interval boundaries is interpolated using a voltage ramp, comprising:

a. Aligning the voltage ramp relative to the time-interval boundaries;
   b. Determining alignment of the voltage ramp relative to a reference-clock signal having a known relationship to the time-interval boundaries;
   c. Sampling the voltage ramp at a plurality of known times relative to the time-interval boundaries; and
   d. Determining slope of the voltage ramp as a function of time from the voltage samples,
   wherein sampling the voltage ramp at a plurality of known times comprises: starting the voltage ramp following a first number of cycles of the reference-clock signal following coincidence of the interval-clock signal and the reference-clock signal, and sampling the voltage ramp at a subsequent clock edge of the interval-clock signal to obtain a first voltage sample.

3. The method of claim 2, wherein sampling the voltage ramp at a plurality of known times comprises: starting the voltage ramp following a second number of cycles of the reference-clock signal following coincidence of the interval-clock signal and the reference-clock signal; and sampling the voltage ramp at a subsequent clock edge of the interval-clock signal to obtain a second voltage sample.

4. The method of claim 3, wherein the interval-clock signal and the reference-clock signal are substantially out of phase with one another when voltage ramp is sampled.

5. The method of claim 4, further comprising determining from the phase relationship between the interval-clock signal and the reference-clock signal a time difference between the respective known times at which the voltage ramp is sampled to obtain the first voltage sample and the second voltage sample.

6. The method of claim 5, wherein determining slope of the voltage ramp comprises calculating the a ratio of difference in voltage between the second voltage sample and the first voltage sample to the time difference between the respective known times at which the voltage ramp is sampled to obtain the first voltage sample and the second voltage sample.

* * * * *

UNITED STATES PATENT AND TRADEMARK OFFICE
CERTIFICATE OF CORRECTION

PATENT NO. : 6,819,117 B2
DATED : November 16, 2004
INVENTOR(S) : Kenneth R. Wilsher It is certified that error appears in the above-identified patent and that said Letters Patent is hereby corrected as shown below:

Title page,
Item [56], References Cited, U.S. PATENT DOCUMENTS, insert the following:
-- 5,940,545    08/1999    Kash et al. --
-- 6,028,952    02/2000    Kash et al. --
-- 6,172,512    01/2001    Evans et al. --
-- 6,304,668    10/2001    Evans et al. --
OTHER PUBLICATIONS, insert the following:
-- J. Bude, *Hot-carrier luminescence in Si*, PHYS. REV. B, 45(11), 15 March 1992, pages 5848-5856 --
-- S. Villa et al., *Photon emission from hot electrons in silicon*, PHYS. REV. B, 52 (15), 15 October 1995-I, pages 10993-10999 --
-- J. Kash et al., *Full Chip Optical Imaging of Logic State Evolution in CMOS Circuits*, IEDM 96 Late News Paper (1996) 1, pages 934-936 --
-- D. Knebel et al., *Diagnosis and Characterization of Timing-Related Defects by Time-Dependent Light Emission*, ITC PROCEEDINGS 1998 --
-- M. Bruce et al., *Waveform Acquisition from the Backside of Silicon Using Electra-Optic Probing*, PROCEEDINGS FROM THE 25th INTERNATIONAL SYMPOSIUM FOR TESTING AND FAILURE ANALYSIS, 14-18 November 1999, pages 19-25 --
-- T. Eiles et al., *Optical Probing of VLSI IC's from the Silicon Backside*, PROCEEDINGS FROM THE 25TH INTERNATIONAL SYMPOSIUM FOR TESTING AND FAILURE ANALYSIS, 14-18 November 1999, pages 27-33--
-- M. McManus, *Picosecond Imaging Circuit Analysis of the IBM G6 Microprocessor Cache*, PROCEEDINGS FROM THE 25TH INTERNATIONAL SYMPOSIUM FOR TESTING AND FAILURE ANALYSIS, 14-18 November 1999, pages 35-38 --
-- N. Goldblatt et al., *Unique and Practical IC Timing Analysis Tool Utilizing Intrinsic Photon Emission*, MICROELECTRONICS RELIABILITY 41 (2001) 1507-1512 --
-- G. Dajee et al., *Practical, Non-Invasive Optical Probing for Flip-Chip Devices*, ITC Paper 15.3 (Baltimore, October 28 – November 2, 2001) 433-442 --
-- *IDS® PICA, Advanced Optical Imaging for Analysis of 0.13-micron and SOI Devices*, Schlumberger Semiconductor Solutions brochure printed 3/01, four pages --

UNITED STATES PATENT AND TRADEMARK OFFICE
CERTIFICATE OF CORRECTION

PATENT NO.    : 6,819,117 B2
DATED         : November 16, 2004
INVENTOR(S)   : Kenneth R. Wilsher It is certified that error appears in the above-identified patent and that said Letters Patent is hereby corrected as shown below:

<u>Title page, (cont.)</u>
-- FOREIGN PATENT DOCUMENTS  0 937 989 A2   08/1999   EPO --

Signed and Sealed this

Nineteenth Day of April, 2005

JON W. DUDAS
*Director of the United States Patent and Trademark Office*